(12) United States Patent
Shahbazi et al.

(10) Patent No.: US 10,039,180 B2
(45) Date of Patent: Jul. 31, 2018

(54) DIELECTRIC TAPE COMPOSITIONS

(71) Applicant: Heraeus Precious Metals North America Conshohocken LLC, West Conshohocken, PA (US)

(72) Inventors: Samson Shahbazi, Roslyn, PA (US); Steven Grabey, Hazleton, PA (US); Mark Challingsworth, Glenside, PA (US); Ryan Persons, Newtown Square, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 15/511,841

(22) PCT Filed: Apr. 5, 2016

(86) PCT No.: PCT/US2016/025983
§ 371 (c)(1),
(2) Date: Mar. 16, 2017

(87) PCT Pub. No.: WO2016/175987
PCT Pub. Date: Nov. 3, 2016

(65) Prior Publication Data
US 2017/0303387 A1    Oct. 19, 2017

Related U.S. Application Data

(60) Provisional application No. 62/153,947, filed on Apr. 28, 2015.

(51) Int. Cl.
*C03C 8/16* (2006.01)
*H05K 1/02* (2006.01)
(Continued)

(52) U.S. Cl.
CPC .......... *H05K 1/0204* (2013.01); *C03C 3/062* (2013.01); *C03C 3/076* (2013.01); *C03C 4/16* (2013.01);
(Continued)

(58) Field of Classification Search
CPC .. C03C 3/066; C03C 8/04; C03C 8/24; G01L 9/0052; G01L 19/147; G01L 19/148; H01L 29/66007; H01L 29/84
See application file for complete search history.

(56) References Cited

U.S. PATENT DOCUMENTS 4,821,142 A * 4/1989 Ushifusa ................. C03C 3/066
174/256
5,059,566 A * 10/1991 Kanai ..................... C03C 3/064
361/321.5

(Continued)

FOREIGN PATENT DOCUMENTS

EP    1369397 A1    12/2003
EP    2952486 A1    12/2015

*Primary Examiner* — Noah S Wiese
(74) *Attorney, Agent, or Firm* — Blank Rome LLP; Charles R. Wolfe, Jr.; Cole T. Duncan

(57) ABSTRACT

A dielectric tape suitable for use in an electronic device is provided. A dielectric slip composition comprises an organic vehicle and a dielectric glass composition comprising at least about 20 wt % and no more than about 50 wt % silicon dioxide, based upon 100% total weight of the glass composition, at least about 10 wt % and no more than about 50 wt % alkali metal oxides, based upon 100% total weight of the glass composition, and at least about 1 wt % and no more than about 10 wt % of at least one transition metal oxide. A method of forming an electronic device is also provided. The method includes the steps of applying at least one dielectric tape to at least one non-planar surface of a substrate, and subjecting the at least one dielectric tape to one or more thermal treatment steps to form a dielectric layer.

16 Claims, 1 Drawing Sheet

(51) Int. Cl.
  *C03C 8/20*   (2006.01)
  *C03C 8/02*   (2006.01)
  *C03C 3/062*  (2006.01)
  *C03C 3/076*  (2006.01)
  *C03C 4/16*   (2006.01)
  *C09K 5/14*   (2006.01)
  *H05K 1/05*   (2006.01)
  *H05K 3/46*   (2006.01)
  *C03B 19/00*  (2006.01)

(52) U.S. Cl.
  CPC .............. *C03C 8/02* (2013.01); *C03C 8/16* (2013.01); *C03C 8/20* (2013.01); *C09K 5/14* (2013.01); *H05K 1/0271* (2013.01); *H05K 1/05* (2013.01); *H05K 3/4608* (2013.01); *C03B 19/00* (2013.01); *C03C 2204/00* (2013.01); *C03C 2205/00* (2013.01); *H05K 2201/068* (2013.01)

(56) References Cited

U.S. PATENT DOCUMENTS

| | | | | |
|---|---|---|---|---|
| 6,108,192 | A * | 8/2000 | Sugimoto | C03C 3/064 361/321.1 |
| 6,197,480 | B1 * | 3/2001 | Iguchi | C03C 3/064 430/198 |
| 7,079,374 | B1 * | 7/2006 | Kim | C03C 3/064 361/312 |
| 7,666,328 | B2 * | 2/2010 | Nair | H01L 23/49883 252/514 |
| 2006/0293168 | A1 * | 12/2006 | Mori | C03C 3/066 501/136 |
| 2009/0004366 | A1 * | 1/2009 | Onoda | C03C 3/066 427/77 |
| 2013/0168785 | A1 * | 7/2013 | Monichino | G01L 9/0052 257/415 |

\* cited by examiner

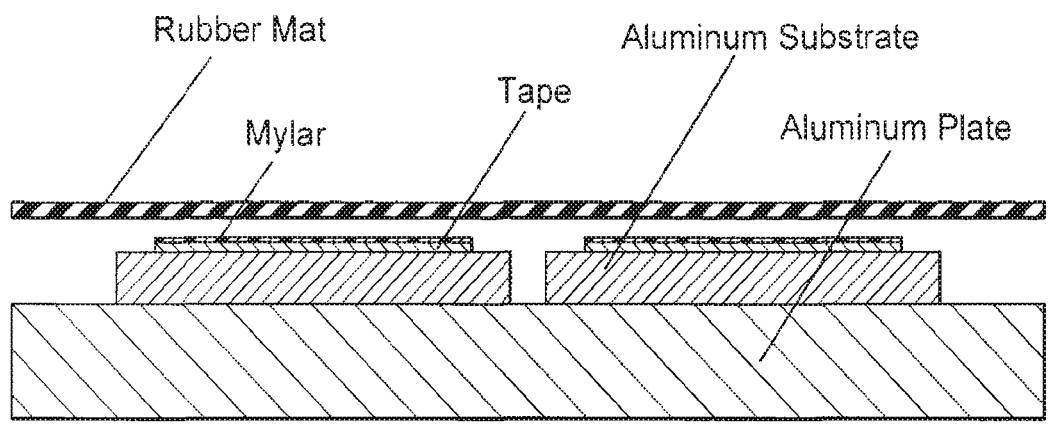

DIELECTRIC TAPE COMPOSITIONS

RELATED APPLICATIONS

The present application is a National Phase of PCT Patent Application Number PCT/US2016/025983 filed Apr. 5, 2016, which claims priority to U.S. Provisional Application No. 62/153,947 filed Apr. 28, 2015. The entire disclosures of those applications are hereby incorporated by reference.

TECHNICAL FIELD

The invention is directed to dielectric tapes which are preferably lead-free. The tapes are particularly useful in forming dielectric layers for thermal management in electronic assemblies and devices.

BACKGROUND

Traditional metal core printed circuit boards (PCBs) are useful in a variety of applications due to their ability to dissipate heat away from electronic components, such as, for example, LEDs. Metal core PCBs (MCPCBs) are generally formed of a base metal, typically aluminum, copper, or alloys thereof, that acts as a heat sink to dissipate heat away from the integral electronic components of the PCB. Metal cores are often used as an alternative to common FR4 boards (fiberglass/epoxy composition material) or CEM3 circuit boards (polytetrafluoroethylene) because of their superior ability to dissipate heat.

Structurally, the PCB of an MCPCB must be attached to the heat sink in order to allow the heat sink to dissipate heat away from the PCB. Some conventional heat sinks have recesses on their surfaces depending on the geometry needed for a particular application. Heat sinks that have recesses can create manufacturing obstacles, as the PCB must be attached mechanically to the heat sink, such as with screws. This adds to the material and manufacturing cost of MCPCB and also creates multiple layers of thermal resistance between the PCB and the heat sink, thus decreasing the heat sink's capacity to dissipate heat away from the electronic components of the PCB.

One method of applying PCB directly onto a heat sink is through processing, whereby the dielectric and conductive layers (or other thermal or electronic layers) are applied directly to the heat sink, such as by screen printing using a thick film paste. However, such thick film pastes are not suitable for application to heat sinks with recessed cavities, as screen printing requires application to a substantially planar surface.

As such, there is a need for an improved method of applying dielectric (and conductive) layers directly to heat sinks with surfaces having recessed cavities, or otherwise non-planar surfaces. Methods which allow for direct application of dielectric compositions to heat sinks with recessed cavities would decrease material and manufacturing cost while maintaining the thermal dissipation properties of the heat sink.

SUMMARY

An aspect of the invention provides a thick film dielectric tape that may be applied directly to a substrate or housing (for example, a substrate or housing having an uneven surface, e.g., a recessed cavity) and which exhibits suitable heat dissipation, electrical performance and adhesion to the underlying substrate, while also maintaining durability at elevated humidity levels. The dielectric tape compositions of the invention allow for the efficient formation of hybrid thick film circuits by applying various thick film materials, such its conductors, resistors, dielectrics, and the like to substrates in fewer manufacturing steps.

The invention provides a dielectric slip composition suitable for forming a tape, comprising an organic vehicle, a dielectric glass composition, and at least about 1 wt % and no more than about 10 wt % of at least one transition metal oxide, based upon 100% total weight of the dielectric slip composition. The dielectric glass composition comprises at least about 20 wt % and no more than about 50 wt % silicon dioxide, based upon 100% total weight of the glass composition, and at least about 10 wt % and no more than about 50 wt % alkali metal oxides, based upon 100% total weight of the glass composition.

The invention further provides a method of preparing a dielectric tape comprising the steps of (a) applying a dielectric slip composition to at least one surface of a backing film, (b) removing the solvent from the dielectric slip composition, and (c) optionally, removing the backing film. The dielectric slip composition comprises an organic vehicle comprising a solvent, a dielectric glass composition comprising, and at least about 1 wt % and no more than about 10 wt % of at least one transition metal oxide, based upon 100% total weight of the dielectric slip composition. The dielectric glass composition comprises at least about 20 wt % and no more than about 50 wt % silicon dioxide, based upon 100% total weight of the glass composition, and at least about 10 wt % and no more than about 50 wt % alkali metal oxides, based upon 100% total weight of the glass composition.

The invention is also directed to a method forming an electronic device comprising the steps of applying at least one dielectric tape to at least one non-planar surface of a substrate; and subjecting the at least one dielectric tape to one or more thermal treatment steps to form a dielectric layer.

BRIEF DESCRIPTION OF THE FIGURES

FIG. 1 depicts a schematic of the tape applied to the aluminum substrates described in Example 1.

DETAILED DESCRIPTION

As set forth herein, the invention is directed to a dielectric composition suitable for use in electronic devices. In one embodiment, the dielectric composition is formed into a dielectric tape which can be directly applied to a substrate, such as one will an uneven surface, such as a surface having recessed cavities.

The dielectric tape of the invention generally comprises a dielectric slip composition processed into a tape on a backing film. Once the slip composition is applied to the backup film to a specified thickness, it may then be dried to remove the organic solvent component (discussed below). The resulting dielectric tape may then be directly applied to a substrate with the backing film still attached, or the backing film may be removed prior to applying the dielectric tape to the substrate.

In a preferred embodiment, the dielectric tape is formed of a slip composition that comprises an organic vehicle and a dielectric glass frit. Preferably, the slip composition further comprises at least one transition metal oxide. The resulting dielectric tape preferably has sufficient insulation resistance and breakdown voltage such that it electrically isolates the electronic components of circuit from the metal substrate (e.g., a heat sink). The dielectric tape preferably adheres well to the substrate, particularly a substrate containing recessed cavities, and exhibits durability in environments with elevated humidity and temperature (for example, at 85° C./85% relative humidity).

Glass Frit Composition

The glass frit of the composition preferably includes oxide(s) which provide certain characteristics to the glass composition, such as certain electrical and thermal properties. In one embodiment, the slip composition preferably includes at least about 30 wt % of the glass frit composition, preferably at least about 40 wt %, and most preferably at least about 45 wt %, based upon 100% total weight of the slip composition. At the same time, the slip composition preferably includes no more than about 80 wt % dielectric glass, and preferably no more than about 70 wt %, based upon 100% total weight of the slip composition.

In one embodiment, the dielectric glass frit has a coefficient of thermal expansion (CTE) of about 13-20 ppm/° C. When a dielectric tape (which includes the dielectric glass frit set forth herein) is applied directly to a substrate, it is preferred that the dielectric tape have a CTE that is less than or equal to that of the substrate, such that when the assembly is subjected to heating and subsequent cooling, the materials expand and contract at similar rates and are less likely to crack or bow. In one embodiment, the CTE of the dielectric tape is not significantly less than the CTE of the substrate, so as to avoid undue stresses that can result in cracking or bowing.

As set forth herein, the CTE is measured using a thermal mechanical analyzer (TMA). While dependent on the glass transition temperature, the CTE is typically measured between 50-200° C. at a heating rate of 10° C./minute. First, about 0.5-1 grams (based on a density of 3.05 g/cm³) of the glass powder is added to fill a 6 mm (inside diameter) pellet die. Using a Carver Hydraulic Press (manufactured by Carver, Inc. of Wabash, Ind.), the powder is pressed with a force of about 130-150 lbs. (2950-3425 psi) for 60 seconds. Using a TA instrument TMA Q400em (manufactured by TA Instruments of New Castle, Del.) and corresponding Universal Analysis 2000 software, the pellet height is measured and the pellet is pre-fired from 50-200° C. in air (below the glass transition temperature) at a rate of 10° C./minute with an applied probe force of 0.2 Newtons. The pellet is allowed to cool to 40° C. The pellet height is re-measured and the pellet is then heated to a temperature of about 600° C. (just beyond the softening point) at a rate of 5° C./minute. The CTE is then calculated by the software.

Another characteristic of the dielectric glass frit is the glass transition temperature ($T_g$). At the $T_g$ of a material, the amorphous substance transforms from a rigid solid to a partially mobile undercooled melt. The desired $T_g$ of the dielectric glass frit is preferably no more than about 500° C., and most preferably no more than about 450° C. At the same time, the $T_g$ of the dielectric glass frit is preferably at least about 320° C., preferably at least about 350° C. The glass transition temperature may be determined by Differential Scanning Calorimetry (DSC) using an SDT Q600 instrument and corresponding Universal Analysis 2000 software, both available from TA instruments-Waters LLC of New Castle, Del. An amount of about 20-30 mg of the sample is weighed into the sample pan with an accuracy of about 0.01 mg. The empty reference pan and the sample pan are placed in the apparatus, the oven is closed, and the measurement stared. A heating rate of 10° C./min is employed from a starting temperature of 25° C. to an end temperature of about 600° C. The first step in the DSC signal is evaluated as the glass transition temperature $T_g$ using the software described above, and the determined onset value is taken as the temperature for $T_g$.

Yet another characteristic or the dielectric glass frit is the glass softening temperature. The glass softening temperature marks the temperature at which the glass material begins to soften beyond some arbitrary softness, or the maximum temperature at which a glass can be handled without permanent deformation. The glass softening temperature of the dielectric glass frit is preferably no more than about 475° C., and most preferably no more than about 450° C. As set forth herein, the glass softening temperature is measured in the same manner as CTE (set forth above). Specifically, the softening temperature may be calculated by the TA Instrument TMA Q400em equipment and corresponding software under the same testing parameters. The softening temperature represents the onset temperature where the material experiences a sharp change from increasing (expansion) to decreasing dimension change.

The dielectric glass frit particles can exhibit a variety of sizes and surface areas. One way to characterize the size of the glass composition particles is the median particle diameter ($d_{50}$) Median particle diameter ($d_{50}$) is a characteristic of particles well known to the person skilled in the art. The $d_{50}$ is the median diameter or the medium value of the particle size distribution. It is the value of the particle diameter at 50% in the cumulative distribution. It is preferred that the median particle diameter ($d_{50}$) of the glass composition particles is at least about 0.5 μm, and preferably at least about 1 μm. At the same time, the $d_{50}$ is preferably no more than about 8 μm, preferably no more than about 6 μm, and most preferably no more than about 5 μm. In a most preferred embodiment, the $d_{50}$ of the dielectric glass particles is 2-5 μm. The maximum particle size of the glass frit particles in the mixture is preferably about 10 μm.

Particle size distribution may be measured via laser diffraction, dynamic light scattering, imaging, electrophoretic light scattering, particle sedimentation, or any other method known in the art. As set forth herein, a Horiba LA-910 Laser Diffraction Particle Size Analyzer connected to a computer with a LA-910 software program is used to determine the median particle diameter of the glass frit particles. The relative refractive index of the glass frit particle is chosen from the LA-910 manual and entered into the software program. The test chamber is filled with deionized water or isopropyl alcohol (IPA) to the proper fill line on the tank. The solution is then circulated by using the circulation and agitation functions in the software program. After one minute, the solution is drained. This is repeated an additional time to ensure the chamber is clean of any residual material. The chamber is than tilted with deionized water or IPA for a third time and allowed to circulate and agitate for one minute. Any background particles in the solution are eliminated by using the blank function in the software. The glass powder (dry or dispersed in water or IPA) is slowly added to the solution in the test chamber until the transmittance bars are in the proper zone in the software program. Once the transmittance is at the correct level, ultrasonic agitation is started and run for 30 seconds to prevent agglomeration. Alter the ultrasonic agitation has stopped, the laser diffraction analysis is run and the particle size distribution of the glass frit component is measured and given as $d_{50}$.

In one embodiment, the dielectric glass frit includes silicon dioxide and one or more alkali metal oxides. The silicon dioxide imparts the dielectric glass frit with sufficient durability when the glass is subjected to a humid environment (for example, an environment with at least 85% relative humidity). This enhances the durability of an electronic device incorporating the dielectric tape that is used outside and is exposed to a variety of weather elements. The alkali metal oxides provide the glass frit with a beneficial increase in its coefficient of thermal expansion (CAT).

The silicon dioxide and alkali metal oxide components are carefully balanced, as high silicon dioxide content reduces the CTE and alkali metal oxide content has a detrimental effect on durability. Thus, the glass frit preferably includes a sufficient amount or silicon dioxide to impart durability to the dielectric composition. In one embodiment, the glass frit includes at least about 20 wt % silicon dioxide, and preferably no more than 50 wt %, based upon 100% total weight of the glass composition. At the same time, the glass frit preferably includes at least about 10 wt % alkali metal oxides, and preferably no more than about 50 wt %, based upon 100% total weight of the dielectric glass composition. In one embodiment, the alkali metal oxides include at least one of sodium oxide (e.g., $Na_2O$), potassium oxide (e.g., $K_2O$), and lithium oxide $Li_2O$).

In a preferred embodiment, the glass frit is lead-free, or substantially lead free, for example, contain less than 0.5 wt % lead based upon 100% total weight of the glass frit composition. In another embodiment, the glass frit is bismuth-free, boron-free or both, for example, containing less than 1 wt % bismuth and boron, collectively, based upon 100% total weight of the glass frit composition.

The glass frit may also include other oxides, such as those which impart the glass with improved electrical performance, adhesion, and durability. Suitable oxides include, but are not limited to, metal or metalloid oxides such as vanadium oxide, aluminum oxide, titanium oxide, barium oxide, antimony oxide, zinc oxide, manganese oxide, phosphorus oxide, calcium oxide, and combinations thereof. These oxides or a combination thereof are preferably present in the dielectric glass composition (in total) at an amount of at least about 10 wt %, preferably at least about 20 wt %, and most preferably at least about 30 wt %, based upon 100% total weight of the glass frit composition. At the same time, the additional oxides are preferably no more than about 60 wt %, and most preferably no more than about 50 wt %, based upon 100% total weight of the glass frit composition.

In a preferred embodiment, the glass frit comprises the following: less than about 1 wt % $Al_2O_3$, about 1-5 wt % BaO, about 1-5 wt % $P_2O_5$, about 5-15 wt % $K_2O$, about 25-40 wt % $SiO_2$, about 15-25 $Na_2O$, about 15-25 wt % $TiO_2$, about 1-5 wt % $Sb_2O_3$, less than about 1 wt % $Bi_2O_3$, less than about 1 wt % $B_2O_3$, less than about 1 wt % CaO, about 1-5 wt % $Li_2O$, about 3-10 wt % $V_2O_5$, about less than about 1 wt % ZnO, based upon 100% total weight of the glass.

Organic Vehicle

The slip composition further comprises an organic vehicle. The organic vehicle provides the medium through which the dielectric glass frit is formed into a dielectric tape composition. It imparts the desired viscosity and rheology to slip composition, which allows the slip to be roll cast and attached to the backing film. Organic vehicles used in dielectric slip compositions can include a combination of solvents, binders, and other additives (e.g., surfactants, plasticizers, and thixotropic agents) to produce desired flow properties, drying behavior, and green strength for a given application. At a minimum, the organic vehicle includes at least one binder (e.g., polymeric organic binder). The organic polymer binder facilitates the processing of the slip (or slurry) of the glass frit and organic vehicle into a tape.

In one embodiment, the dielectric slip composition includes at least about 10 wt % organic vehicle, preferably at least about 10 wt %, and most preferably at least about 15 wt %, based upon 100% total weight of the slip composition. At the same time, the slip composition includes no more than about 40 wt % organic vehicle, preferably no more than about 35 wt %, and most preferably no more than about 30 wt %, based upon 100% total weight of the slip composition.

In one embodiment, the organic vehicle includes at least one binder that has a curing temperature that is compatible with the thermal processing temperatures of the substrate. Preferred binders are polymeric binders, monomeric binders, and binders which are a combination of polymers and monomers. In a preferred embodiment, thermoplastic binders are used. Preferred thermoplastic binders include acrylic resins and polyvinyl butyral resins. The binder may be present in the organic vehicle in an amount of at least about 20 wt %, preferably at least about 30 wt %, and most preferably at least about 40 wt %, based upon 100% total weight of the organic vehicle. At the same time, the binder is preferably present in an amount of no more than about 80 wt %, preferably no more than about 70 wt %, based upon 100% total weight of the organic vehicle.

The organic vehicle of the slip composition also includes one or more solvents. Any solvent known in the art may be used. Preferred solvents include, but are not limited to, methyl ethyl ketone (MEK), methyl isobutyl ketone (MIBK), methanol, ethanol, and isopropyl alcohol (IPA). The solvent is not particularly limited as long as it provides the slip composition with sufficient viscosity and rheology so as to be able to form a dielectric tape. In a preferred embodiment, the solvent has boiling point of less than 150° C., preferably less than 120° C.

In one embodiment, the organic vehicle comprises at least about 20 wt % total solvent, preferably at least about 25 wt %, based upon 100% total weight of the dielectric tape. At the same time, the solvent(s) may be present in an amount of no more than about 70 wt %, preferably no more than about 60 wt %, based upon 100% total weight of the organic vehicle.

The organic vehicle may also comprise one or more additives. Preferred additives in the vehicle are those which are distinct from the aforementioned vehicle components and which contribute to favorable viscosity and rheology of the dielectric slip composition. Additionally, preferred additives provide flexibility and/or strength to the resulting dielectric tape. Preferred additives include, but are not limited to, surfactants, plasticizers, thixotropic agents, viscosity regulators, stabilizing agents, inorganic additives, thickeners, hardeners, diluents, emulsifiers, dispersants, pH regulators, and any combination thereof.

Plasticizers increase the plasticity, fluidity, and flexibility of the slip composition allowing for more efficient application to the backing film as the plasticizer makes the tape less brittle and easier to handle. Any plasticizer known in the art that is compatible with the other vehicle components may be used. In one embodiment, butyl benzyl phthalate, polyoxyethylene aryl ether, or epoxidized octyl tallate is used as the plasticizer. The plasticizer may be present in an amount of at least about 0.1 wt % preferably at least about 1 wt %, based upon 100% total weight of the organic vehicle. At the same time, the plasticizer is preferably present in an amount of no more than about 15 wt %, preferably no more than about 12 wt %, based upon 100% total weight of the organic vehicle.

Thixotropic agents are preferably used to adjust the rheology of the slip composition to result in a more uniform casting, particularly for slips with low viscosity. Thixotropic agents also induce shear thinning behavior, which leads to improved printability. Any thixotropic agent known in the art that is compatible with the other vehicle components may be used. Preferred thixotropic agents include, but are not limited to, carboxylic acid derivatives, preferably fatty acid derivatives or combinations thereof. Preferred fatty acid derivatives include, but are not limited to, saturated and unsaturated fatty acids, e.g., $C_8$-$C_{20}$ fatty acids, such as $C_9H_{19}COOH$ (capric acid), $C_{11}H_{23}COOH$ (lauric acid), $C_{13}H_{27}COOH$ (myristic acid) $C_{15}H_{31}COOH$ (palmitic acid), $C_{17}H_{35}COOH$ (stearic acid), $C_{18}H_{34}O_2$ (oleic acid), $C_{18}H_{32}O_2$ (linoleic acid) or combinations thereof. A preferred combination comprising fatty acids in this context is castor oil. Addition thixotropic agents include, but are not limited to, Thixatrol® ST, Thixatrol® PLUS, and Thixatrol® MAX (manufactured by Elementis Specialties, Inc.). In a preferred embodiment, the dielectric composition includes at least one thixotropic agent, such as BYK®-410 (which contains 1-methyl-2-pyrrolidone and lithium chloride) available from BYK Additives Inc. of Austin, Tex. These components may be incorporated with the solvent and/or solvent/binder mixture, or they may be added directly into the slip composition. If present, the thixotropic agent is preferably at least about 0.1 wt % and preferably no more than about 10 wt %, based upon 100% total weight of the organic vehicle.

In one embodiment, the dielectric slip composition has a viscosity sufficient to form a layer on the backing film and ultimately on the substrate. Viscosity is measured using a Brookfield® Model DV-III Programmable Rheometer. Specifically, the sample is measured in a 16 oz. jar using a #03 spindle, and the measurement is taken after one minute at 20 RPM. According to one embodiment, the dielectric slip composition has a viscosity of at least about 500 cPs, preferably at least about 700 cPs, and most preferably at least about 800 cPs. At the same time, the dielectric slip composition preferably has a viscosity of no more than about 2000 cPs, and preferably no more than about 1900 cPs. In a most preferred embodiment, the dielectric slip composition has a viscosity between 900 and 1600 cPs.

In one embodiment, the resulting dielectric tape composition has a solids content (i.e., total inorganic component) sufficient to provide the desired electrical performance and fired film thickness of the dielectric tape layer. According to one embodiment, the dielectric tape has a solids content of at least about 50%, preferably at least 60%, and more preferably at least 70%, based upon the total weight the dielectric tape composition. At the same time, the tape preferably has a solids content of no more than about 90%. To measure the solids content, the weight of an uncoated substrate used for the particular application (e.g., steel or aluminum) is measured. Approximately one gram of tape is applied to substrate. The weight of the coated substrate is again measured. The tape coated substrate is placed in a box oven at about 150° C. and dried for about 15-30 minutes. The coated part is fired according to the desired firing profile for the given application. The final weight of the fired coated substrate is again measured. The weight of the uncoated substrate is then subtracted from the weight of the tape coated substrate and from the weight of the fired coated substrate to calculate the weight of the wet tape and the fired tape, respectively. The solids content (in %) is calculated by dividing the fired tape weight by the wet tape weight. The solids content can also be determined by TGA (Thermal Gravimetric Analysis). In this method, a small amount of wet tape (e.g., at least 20 mg) is added to an alumina crucible. The crucible is heated at a pre-defined rate, typically about 10° C./minute or 20°/C. minute depending on the composition of the tape, to the desired peak temperature. The calculated residue remaining at the peak temperature represents the solids content of the tape.

Additives

According to one embodiment, the dielectric slip composition may also include additives distinct from the glass frit and the organic vehicle. Preferred additives contribute to the adhesive performance, electrical performance and durability of the resulting tape. All additives known in the art may be employed as additives in the dielectric slip composition. Preferred additives include, but are not limited to, plasticizers, solvents, and surfactants, all of the foregoing distinct from the organic vehicle components, as well as inorganic additives.

The dielectric slip composition preferably includes at least one surfactant. All surfactants which are known in the art, and which are considered to be suitable in the context of this invention, may be employed as the surfactant in the organic vehicle. Preferred surfactants include, but are not limited to, those based on linear chains, branched chains, aromatic chains, fluorinated chains, siloxane chains, polyether chains and combinations thereof. Preferred surfactants include, but are not limited to, single chained, double chained or poly chained. Suitable surfactants include, but are not limited to, non-ionic, anionic, cationic, amphiphilic, or zwitterionic compounds. Preferred surfactants include, but are not limited to, polymeric or monomeric or a mixture thereof. In one embodiment, the organic vehicle includes a non-phthalate surfactant. In one embodiment, the surfactant may have pigment affinic groups, preferably hydroxyfunctional carboxylic acid esters with pigment affinic groups (e.g., DISPERBYK® surfactants manufactured by BYK USA, Inc.) The surfactant may be present in an amount of at least about 0.1 wt %, preferably at least about 1 wt %, based upon 100% total weight or the dielectric slip composition. At the same time, the surfactant is preferably present in an amount of no more than about 15 wt %, preferably no more than about 10 wt %, and most preferably no more than about 5 wt %, based upon 100% total dielectric slip composition.

Preferred inorganic additives include, but are not limited to, transition metals such as nickel, zirconium, titanium, manganese, tin, ruthenium, cobalt, iron, copper, chromium, tungsten, molybdenum, zinc, and oxides thereof. In a preferred embodiment, the slip composition includes at least one transition metal oxide. The slip composition may comprise titanium oxide as a distinct additive apart from the glass frit composition. In one embodiment, the dielectric slip composition includes at least about 1 wt %, preferably at least about 2 wt %, and most preferably at least about 3 wt % titanium oxide, and pre tenably no more than about 10 wt %, more preferably no more than about 8 wt %, based upon 100% total weight of the slip composition.

The slip composition may also include alkaline and alkaline earth metals and oxides thereof, post-transition metals such as boron, silicon, germanium, tellurium, gadolinium, lead, bismuth, and antimony, rare earth metals, such as lanthanum and cerium, oxides, mixed metal oxides, complex compounds, amorphous or partially crystallized glasses formed from those oxides, or any combination of at least two thereof.

In a preferred embodiment, the dielectric slip composition includes about 52 wt % glass frit, about 6 wt % $TiO_2$ additive, about 19 wt % organic vehicle, and about 23 wt % organic additives, including solvent and surfactant.

Forming the Dielectric

To form the dielectric tape, the components of the organic vehicle are combined using any method known in the art for preparing an organic vehicle. The method preferably results in a homogenously dispersed composition. The glass frit particles and additives(s) (if present) are then mixed together with the organic vehicle according to any known method in the art, such as, for example, with a mixer, and then milled to form a dispersed uniform low viscosity composition, known as the slip composition.

The slip composition is then applied to at least one surface of a backing film to form the dielectric tape. In one embodiment, the slip composition is roll cast onto the backing film. In this method, the backing film is held on a roll, and as the tape is transferred over a platform to another empty roll, the slip composition is applied to the backing film using a fixed height blade. Drying occurs simultaneously as the backing film with the dielectric slip composition is wrapped onto the second roll. Any suitable backing film that includes a release agent on at least one of its sides may be used. Suitable backing films include, but are not limited to, polyester films, silicon-coated polyethylene terephthalate (PET) films (such as those manufactured by Hansung Systems), and release liners (such as those manufactured by Saint-Gobain Performance Plastics).

In one embodiment, the slip composition is applied to the at least one surface of the backing film at a thickness of at least about 100 µm and preferably no more than about 200 µm, preferably no more than about 180 µm, and more preferably no more than about 170 µm. In one embodiment, the thickness is about 100 µm to about 150 µm.

The resulting dielectric tape is then dried to remove volatile organic components (i.e., solvents) present in the organic vehicle, thereby forming a dielectric green tape. In one embodiment, the drying is performed at a temperature of at least about 50° C. and no more than about 100° C. using a combination of high air flow and radiant heat for at least 10-15 minutes. However, any method of drying, known in the art may be employed. At this point, the backing film may be removed from the dielectric tape, such as by peeling. In another embodiment, the backing film may remain attached to the dielectric tape until the dielectric tape is applied to the substrate.

Formation of Dielectric Layers

The dielectric tape may be used to form dielectric layers in an electronic device. An electronic device is generally comprised of a substrate and a variety of layers applied to the substrate having certain electrical and/or thermal properties. Any substrate known to one skilled in the art and suitable for use in any particular electronic application may be used. Suitable substrates may be chosen based upon such factors as temperature restriction, electrical, or mechanical properties. The CTE of the dielectric tape is preferably less than or equal to the CTE of the substrate so as to avoid cracking or bowing during heating/cooling. In one embodiment, the substrate has a CTE of at least about 10 ppm/K. At the same time, the substrate preferably has a CTE of no more than about 25 ppm/K. Preferably, the substrate is aluminum or steel.

The dielectric tape may be directly applied to at least one surface of the substrate using any methods known in the art, such as by pressing. In one embodiment, the dielectric tape may be applied in one layer or multiple layers (i.e., stacked) to form a dielectric layer with a desired thickness. As set forth herein, the dielectric tape may be applied directly to the substrate, even within uneven (i.e., non-planar) surfaces, such as recessed cavities. In one embodiment, an electronic circuit may be directly applied to an exposed surface of the dielectric tape using any known application methods to form an electronic device.

In a preferred embodiment, the dielectric tape then undergoes a lamination process. In one embodiment, a uniaxial or isostatic lamination process may be used. In a uniaxial process, a uniaxial press is provided that has two flat steel plates. A specified force and temperature (dependent on the tape composition) are applied to the tape for a period of time to allow for lamination. In an isostatic process, an isostatic press is provided, where a uniform force is applied to the entire dielectric tape on both sides at a designated temperature. When using an isostatic press, the parts should be sealed in a vacuum sealed bag. In one embodiment, the lamination process is conducted at a temperature in a range from about 60° C.-100° C. at a pressure of about 500-5,000 psi for about 2 to 15 minutes.

Once the tape(s) is laminated, the entire assembly, including the substrate and the dielectric tape layers applied thereto, may undergo at least one thermal treatment step. In a further embodiment, the substrate, dielectric tape layers and applied electronic circuits may undergo thermal treatment together. With aluminum substrates, the assembly may be fired in an air or nitrogen atmosphere at temperatures of at least about 500° C., preferably at least about 550° C., and most preferably at least about 580° C. The firing temperature when an aluminum substrate is used preferably does not exceed the melting temperature of aluminum (e.g., about 620° C.). With steel substrates, the assembly may be fired in an air or nitrogen atmosphere at temperatures of at least about 500° C. At the same time, the firing temperature is preferably no more than about 1,000° C. The assembly is preferably fired at peak temperature for at least about 2-3 minutes, preferably at least about 5-7 minutes, but no more than about 25 minutes, and preferably no more than about 20 minutes.

In a preferred embodiment, the fired thick film dielectric layer has a thickness of at least about 30 µm, preferably at least about 40 µm, and most preferably at least about 45 µm. At the same time, the tired thick film dielectric layer preferably has a thickness of no more than about 80 µm, preferably no more than about 75 µm, and most preferably no more than about 70 µm.

The dielectric tape of the invention may be used to form a variety of electronic devices, such as, for example, an electric circuit, solar cell, LED, display, capacitor, resistor, or any combination thereof. In one embodiment, the electronic devices may be applied to the dielectric layer by a pad printing method. The dielectric layer functions to dissipate heat away from the electronic component toward the substrate. In this way, the life of the electronic device may be extended.

Measuring Performance of the Dielectric Layers

The strength and electrical performance of the dried dielectric layers may be evaluated to ensure that they will meet application-specific standards. The strength of the dried dielectric layer is evaluated visually. First, the ability of the dielectric tape to be peeled away from the backing film is observed. If the dielectric tape is able to be fully peeled away from the backing film, with no structural defaults, such as cracks, it is considered to have good strength. If the dielectric tape adheres too much to the backing film, such that it cannot be peeled away as one unitary tape, it has low strength.

The electrical performance of the dielectric layers may be measured according to the parameters set forth in the examples herein. The invention will now be described in conjunction with the following, non-limiting examples.

EXAMPLES

Example 1

Three exemplary dielectric tapes were prepared with a PET backing film. The three tapes had a green thickness (after drying) of 160-170 µm. Each tape was laminated onto a 2.25"×2.25"×0.090" aluminum substrate (3003 grade). Experiments were performed at varying temperatures, pressures and times under load during lamination to access the effect on the quality of the resulting green tape on the aluminum substrate.

A 0.25" aluminum plate was used to hold the aluminum substrates. The tape was placed onto the clean aluminum substrate with the backing film facing upward. A 0.05" rubber mat was placed on top of the substrate with the tape applied thereto. The plates were placed in two vacuum bags, which were placed in a isostatic press at 70° C. and 1250 psi for 10 minutes. The parts ere allowed to cool, removed from the bags and the backing film was removed. This is shown schematically in FIG. 1. All dried films exhibited good durability, as the backing films were easily removed and no structural defects were present in the dielectric tape.

The substrates were then fired under three different conditions. In each case, the fired film thickness was 80 mm. The fired dielectric films were evaluated visually to determine their strength.

TABLE 1

| Firing Parameters for Exemplary Dielectric Tapes | |
|---|---|
| Experiment | Firing Conditions |
| Condition 1 | 3° C./min at >350° C. (dwell 12 minutes) |
| | 20° C./min at >570° C. (dwell 6 minutes) |
| Condition 2 | 5° C./min at >350° C. (dwell 18 minutes) |
| | 20° C./min at >570° C. (dwell 24 minutes) |
| Condition 3 | 5° C./min at >350° C. (dwell 18 minutes) |
| | 20° C./min at >580° C. (dwell 6 minutes) |

The dielectric tape fired under Condition 1 exhibited no visual defects in the fired film (e.g., cracks, line breaks, bubbling). The dielectric tape fired under Condition 2 exhibited some level of defects in the fired film, such that it had average strength. The dielectric tape fired under Condition 3 exhibited almost no visual defects in the fired film. As such, Conditions 1 and 3 were determined to result in the best fired film for the parameters of this example.

Example 2

Another exemplary dielectric tape was prepared with a PET backing film. The tape had a green thickness (after drying) of 105 µm. The tape was laminated onto a 2"×2" aluminum substrate (3003 grade) according to the parameters set forth in Example 1. The substrate was dried at about 150° C. for ten minutes and subsequently fired at about 580° C. for about 4-5 minutes. The fired film thickness of the tape was about 50-55 µm.

The fired substrate was subjected to electrical testing. A breakdown voltage and insulation resistance test is conducted using a Vitrek Dielectric Tester manufactured by Vitrek Corporation of Poway, Calif. Breakdown voltage is measured in either VDC or VAC units. Typical test recipes are prepared by attaching an electrode to a conductor (which is applied to the dielectric tape), and attaching another electrode to the aluminum substrate. A voltage is applied to the top conductor at a slew rate of 100 volts per second until a short or breakdown voltage is recorded. Preferably, a breakdown voltage of greater than 1,000 Volts per Mil and an insulation resistance of at least $10^9 \Omega$ are considered acceptable in the industry.

The adhesive performance of the dielectric tape was measured according to a standard pull force test using a Zwick Roell Z25 Testing Station machine available from Zwick GmbH & Co. KG. To prepare the test specimens, the test leads (formed of solder plated copper 60/40 tin) are first ultrasonically cleaned. The test pad (an 80 mil conductive adhesion pad) is deposited onto the test coupon. The test leads are formed into Shepherds Crooks and attached to the conductive pads on the coupon. The test coupons are dipped in either a mildly activated rosin flux (RMA), non-activated rosin flux (R), or activated rosin flux (RA). The parts are dipped in either a tin-lead solder (e.g., Sn62/Pb38/Ag2, Sn63/Pb37) at about 230° C. or a lead-free solder (e.g., Sn96.5/Ag3/Cu0.5 known as SAC, Sn95/Ag5) at about 250° C. The parts are immersed in the solder for three to five seconds to fully coat the pad. The solder joints are cleaned using an appropriate solvent, preferably acetone, for several minutes before gently cleaning with a soft brush. Typically, a pull force of about 4 lbf or greater is preferred in the industry.

The fired substrate was also placed in a humidity chamber set at a temperature of 85° C. and a relative humidity of 85% (85° C./85 RH) for a period of 150 hours to measure durability at elevated temperature/humidity levels. The substrate also underwent thermal aging at a temperature of about 150° C. for about 150 hours. Lastly, in the thermal cycling test, the substrate underwent 100 cycles of increased temperature (150° C.) for about 150 hours.

The electrical performance and adhesion results are set forth in Table 2 below. The breakdown voltage and insulation resistance values in Table 2 were averaged from 35 data points taken during test, the capacitance, % dissipation factor and K value were averaged frown 10 data points taken during the test, and the adhesion s were averaged from 12 data points taken during the test.

TABLE 2

| Electrical Performance of Example 2 Tape | |
|---|---|
| Average Insulation Resistance (GΩ) | 70.46 |
| Average Capacitance (pF) | 72.25 |
| Average % Dissipation Factor | 0.0468 |
| Average K Value | 16.57 |
| Average Breakdown Voltage (V) | 3573 |
| Average Breakdown Voltage (V/mil) | 1730 |
| Initial Adhesion (lbf) | 4.93 |
| 85° C./85 RII Adhesion (lbf) | 5.13 |
| Thermal Aging Adhesion (lbf) | 5.45 |
| Thermal Cycling Adhesion (lbf) | 5.40 |

These and other advantages of the invention be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

The invention claimed is:

1. A dielectric slip composition suitable for forming a tape, comprising:
   (a) an organic vehicle; and
   (b) a dielectric glass composition comprising:
   (i) at least about 20 wt % and no more than about 50 wt % silicon dioxide, based upon 100% total weight of the glass composition,
   (ii) at least about 10 wt % and no more than about 50 wt % alkali metal oxides, based upon 100% total weight of the glass composition, and
   (iii) at least about 1 wt % and no more than about 10 wt % of at least one transition metal oxide, based upon 100% total weight of the dielectric slip composition,
   wherein the dielectric glass composition has a glass softening temperature of no more than about 475° C.

2. The dielectric slip composition according to claim 1, wherein the dielectric slip composition comprises at least about 30 wt % and no more than about 80 wt % dielectric glass composition, based upon 100% total weight of the dielectric slip composition.

3. The dielectric slip composition according to claim 1, wherein the dielectric glass composition has a coefficient of thermal expansion of about 13-20 ppm/° C. at a temperature range of 50-200° C.

4. The dielectric slip composition according to claim 1, wherein the dielectric glass composition has a glass transition temperature of at least about 320° C. and no more than about 500° C.

5. The dielectric slip composition according to claim 1, wherein the dielectric glass composition is lead-free.

6. The dielectric slip composition according to claim 1, wherein the dielectric glass composition is provided in the form of a glass frit having a median particle diameter of at least about 0.5 µm and no more than about 8 µm.

7. The dielectric slip composition according to claim 1, wherein the organic vehicle is present in an amount of at least about 10 wt % and no more than about 40 wt %, based upon 100% total weight of the dielectric slip composition.

8. The dielectric slip composition according to claim 1, wherein the dielectric slip composition has a solids content of at least about 70% and no more than about 90%.

9. The dielectric slip composition according to claim 1, wherein the at least one transition metal oxide includes titanium oxide.

10. A method of preparing a dielectric tape, comprising:
    (a) applying a dielectric slip composition to at least one surface of a backing film, the dielectric slip composition comprising:
    (i) an organic vehicle comprising a solvent,
    (ii) a dielectric glass composition comprising:
       1. at least about 20 wt % and no more than about 50 wt % silicon dioxide, based upon 100% total weight of the glass composition,
       2. at least about 10 wt % and no more than about 50 wt % alkali metal oxides, based upon 100% total weight of the glass composition, and
    (iii) at least about 1 wt % and no more than about 10 wt % of at least one transition metal oxide, based upon 100% total weight of the dielectric slip composition;
    (b) removing the solvent from the dielectric slip composition; and
    (c) optionally removing the backing film,
    wherein the dielectric slip composition is applied to the surface of the backing film at a thickness of from about 100 to about 200 µm.

11. A method of forming an electronic device, comprising:
    (a) applying at least one dielectric tape prepared according to the method of claim 10 to at least one non-planar surface of a substrate; and
    (b) subjecting the at least one dielectric tape to one or more thermal treatment steps to form a dielectric layer.

12. The method according to claim 11, wherein a plurality of dielectric tapes are applied to the non-planar surface of the substrate in a stacked arrangement.

13. The method according to claim 11, further comprising laminating the at least one dielectric tape prior to the thermal treatment step.

14. The method according to claim 11, wherein the substrate is aluminum or steel.

15. The method according to claim 11, wherein the dielectric tape further includes a backing film attached to a surface thereof, the backing film being removed after the at least one dielectric tape is applied to the at least one non-planar surface of the substrate.

16. The method according to claim 11, wherein the at least one or more thermal treatment steps is performed in an air or nitrogen atmosphere at a temperature of less than 620° C. for aluminum substrates and less than 1,000° C. for steel substrates.

* * * * *